US009306306B2

(12) United States Patent
Nishio et al.

(10) Patent No.: US 9,306,306 B2
(45) Date of Patent: Apr. 5, 2016

(54) TERMINAL

(71) Applicants: AUTONETWORKS TECHNOLOGIES, LTD., Yokkaichi (JP); SUMITOMO WIRING SYSTEMS, LTD., Yokkaichi (JP); SUMITOMO ELECTRIC INDUSTRIES, LTD., Osaka-shi, Osaka (JP)

(72) Inventors: Akihiro Nishio, Yokkaichi (JP); Yasuo Omori, Yokkaichi (JP)

(73) Assignees: Autonetworks Technologies, LTD (JP); Sumitomo wiring systems, LTD (JP); Sumitomo Electric Industries, LTD (JP)

( * ) Notice: Subject to any disclaimer, the term of this patent is extended or adjusted under 35 U.S.C. 154(b) by 22 days.

(21) Appl. No.: 14/376,237

(22) PCT Filed: Jan. 28, 2013

(86) PCT No.: PCT/JP2013/000438
§ 371 (c)(1),
(2) Date: Aug. 1, 2014

(87) PCT Pub. No.: WO2013/118453
PCT Pub. Date: Aug. 15, 2013

(65) Prior Publication Data
US 2015/0031248 A1 Jan. 29, 2015

(30) Foreign Application Priority Data
Feb. 6, 2012 (JP) ................................ 2012-022939

(51) Int. Cl.
*H01R 13/05* (2006.01)
*H01R 13/533* (2006.01)
(Continued)

(52) U.S. Cl.
CPC ............ *H01R 13/05* (2013.01); *H01R 13/2457* (2013.01); *H01R 13/533* (2013.01); *H01R 12/721* (2013.01); *H01R 12/75* (2013.01); *H01R 2201/26* (2013.01)

(58) Field of Classification Search
USPC .......................... 439/862, 691, 630, 637, 660
See application file for complete search history.

(56) References Cited

U.S. PATENT DOCUMENTS 5,634,819 A * 6/1997 Pan ...................... H01R 12/721 439/637
6,315,621 B1 * 11/2001 Natori ................ H01R 13/2428 439/862

(Continued)

FOREIGN PATENT DOCUMENTS

JP 49-59071 5/1974
JP 2002-216914 8/2002
JP 2008-098064 4/2008

OTHER PUBLICATIONS

International Search Report dated Mar. 19, 2013.

*Primary Examiner* — Alexander Gilman
(74) *Attorney, Agent, or Firm* — Gerald E. Hespos; Michael J. Porco; Matthew T. Hespos

(57) ABSTRACT

A terminal used in an electronic circuit unit with a circuit board including a plurality of connection conductors, a housing and a plurality of terminals respectively provided on ends of a plurality of wires includes a wire connecting portion to be connected to an end portion of the wire and a board connecting portion to be connected to the connection conductor. The board connecting portion includes a resiliently deformable first resilient contact piece having a first contact portion to be resiliently brought into contact with the connection conductor and a resiliently deformable second resilient contact piece having a second contact portion to be resiliently brought into contact with the connection conductor common to the connection conductor, with which the first contact portion is brought into contact. The first and second resilient contact pieces are resiliently deformable independently of each other and shaped to have mutually different natural vibration frequencies.

7 Claims, 9 Drawing Sheets

(51) Int. Cl.

*H01R 13/24* (2006.01)
*H01R 12/72* (2011.01)
*H01R 12/75* (2011.01)

(56) References Cited

U.S. PATENT DOCUMENTS 6,905,371 B2 * 6/2005 Yi-Tse .................. H01R 24/62
174/72 R
6,997,751 B2 * 2/2006 Miyamoto ......... H01R 13/2464
439/630
7,559,811 B1 * 7/2009 Polnyi .................. H01R 4/4809
439/591
2002/0055282 A1 * 5/2002 Eldridge .............. G01R 1/0483
439/66
2002/0098740 A1 * 7/2002 Ooya .................. G06K 7/0021
439/630
2009/0035995 A1 * 2/2009 Chang ................ H01R 13/2492
439/630

* cited by examiner

TERMINAL

BACKGROUND OF THE INVENTION

1. Field of the Invention

The invention relates to a terminal used in an electronic circuit unit to be mounted in a vehicle such as an automotive vehicle and connectable to an external circuit via a plurality of wires.

2. Description of the Related Art

Conventionally, many electronic circuit units each including a circuit board incorporated with an electronic circuit and a board connector for connecting wires for external connection to connection conductors on this circuit board are known as electronic circuit units to be mounted in vehicles. Further, a so-called card edge type connector to be mounted on an edge portion of a circuit board is known as a board connector. Such a connector is known, for example, from Japanese Unexamined Patent Publication No. 2008-098064.

As shown in FIG. 8, a card edge connector described in Japanese Unexamined Patent Publication No. 2008-098064 includes a circuit board 110 with connection conductors 111 on an edge part thereof, a board-side housing 120 for housing this circuit board 110, terminals 130 mounted on the tips of wires and connected to the connection conductors 111, and a wire-side housing 140 for housing the terminals 130. Specifically, each terminal 130 includes a wire connecting portion 131 to be mounted on the tip of the wire and a board connecting portion 132 to be connected to the connection conductor of the circuit board as specifically shown in FIG. 9. The board connecting portion 132 includes a main portion 133 in the form of a rectangular tube, a resilient contact piece 134 integrally formed to this main portion 133 and a biasing member 135 mounted in the main portion 133. The resilient contact piece 134 is shaped to be long in a direction in which the terminal 130 is inserted into the wire-side housing 140 (lateral direction in FIG. 9) and integrally connected to the main portion 133 at a base end portion 134*a* (left end in FIG. 9) thereof. This resilient contact piece 134 includes a contact portion 134*b* to be brought into contact with the connection conductor 111 on a side opposite to the base end portion 134*a* (right side in FIG. 9) thereof. The contact portion 134*b* of the resilient contact piece 134 is resiliently displaced in a direction (vertical direction in FIG. 9) perpendicular to a longitudinal direction thereof with the base end portion 134*a* as a supporting point. The main portion 133 includes an opening 133*a* on the lower surface (lower surface in FIG. 9), and the contact portion 134*b* projects to the outside of the main portion 133 through this opening 133*a*. The biasing member 135 is mounted in a compressed state in the main portion 133, and biases the contact portion 134*b* from the inside to the outside of the main portion 133 by a resilient restoring force thereof. As shown in FIG. 8, in a state where this terminal 130 is inserted in the board-side housing 120 and the contact portion 134*b* thereof is held in contact with the connection conductor 111, the contact portion 134*b* is retracted into the main portion 133 against a biasing force of the biasing member 135. In this state, the contact portion 134*b* is pressed into contact with the connection conductor 111 by a resilient force of the compressed biasing member 135.

The card edge connector described in Japanese Unexamined Patent Publication No. 2008-098064 is mounted in the vehicle, and therefore is subject to a vibromotive force during vehicle running or the like. This may possibly cause the resilient contact piece 134 of the terminal 130 to slightly vibrate with the base end portion 134*a* thereof as a supporting point. Normally, since the biasing member 135 is biased to press the contact portion 134*b* into contact with the connection conductor 111, the contact reliability of the contact portion 134*b* and the connection conductor 111 is not affected even if the resilient contact piece 134 slightly vibrates. However, if a vibration frequency of the vehicle and a natural vibration frequency of the resilient contact piece 134 coincide, the resilient contact piece 134 may resonate and heavily vibrate. In this case, there is a concern about a reduction in the contact reliability of the contact portion 134*b* and the connection conductor 111 due to a drastic reduction in the contact pressure of the contact portion 134*b* and the connection conductor 111.

The present invention aims to provide a terminal which is used in an electronic circuit unit and can suppress a reduction in contact reliability even if a resilient contact piece resonates.

SUMMARY OF THE INVENTION

One aspect of the invention is directed to a terminal used in an electronic circuit unit with a circuit board including an edge portion and a plurality of connection conductors on a surface of the edge portion, a housing for housing the circuit board and a plurality of terminals respectively provided on ends of a plurality of wires to be connected to the respective connection conductors of the circuit board and each including a contact portion to be brought into contact with the corresponding connection conductor, including a wire connecting portion to be connected to an end portion of the wire; and a board connecting portion to be connected to the connection conductor; wherein the board connecting portion includes a first resilient contact piece having a first contact portion to be resiliently brought into contact with the connection conductor and resiliently deformable so as to allow a resilient displacement of the first contact portion and a second resilient contact piece having a second contact portion to be resiliently brought into contact with the connection conductor common to the connection conductor, with which the first contact portion is brought into contact, and resiliently deformable so as to allow a resilient displacement of the second contact portion, and the first and second resilient contact pieces are resiliently deformable independently of each other and shaped to have mutually different natural vibration frequencies. Here, the "connection conductor common to the connection conductor, with which the first contact portion is brought into contact" may be a single conductor shaped to be able to simultaneously come into contact with the first and second contact portions, mutually independent conductors to come into contact with the first contact portion and the second contact portion and regarded as a single connection conductor by being connected by wiring or the like.

DETAILED DESCRIPTION OF THE PREFERRED EMBODIMENT

Figure 1:
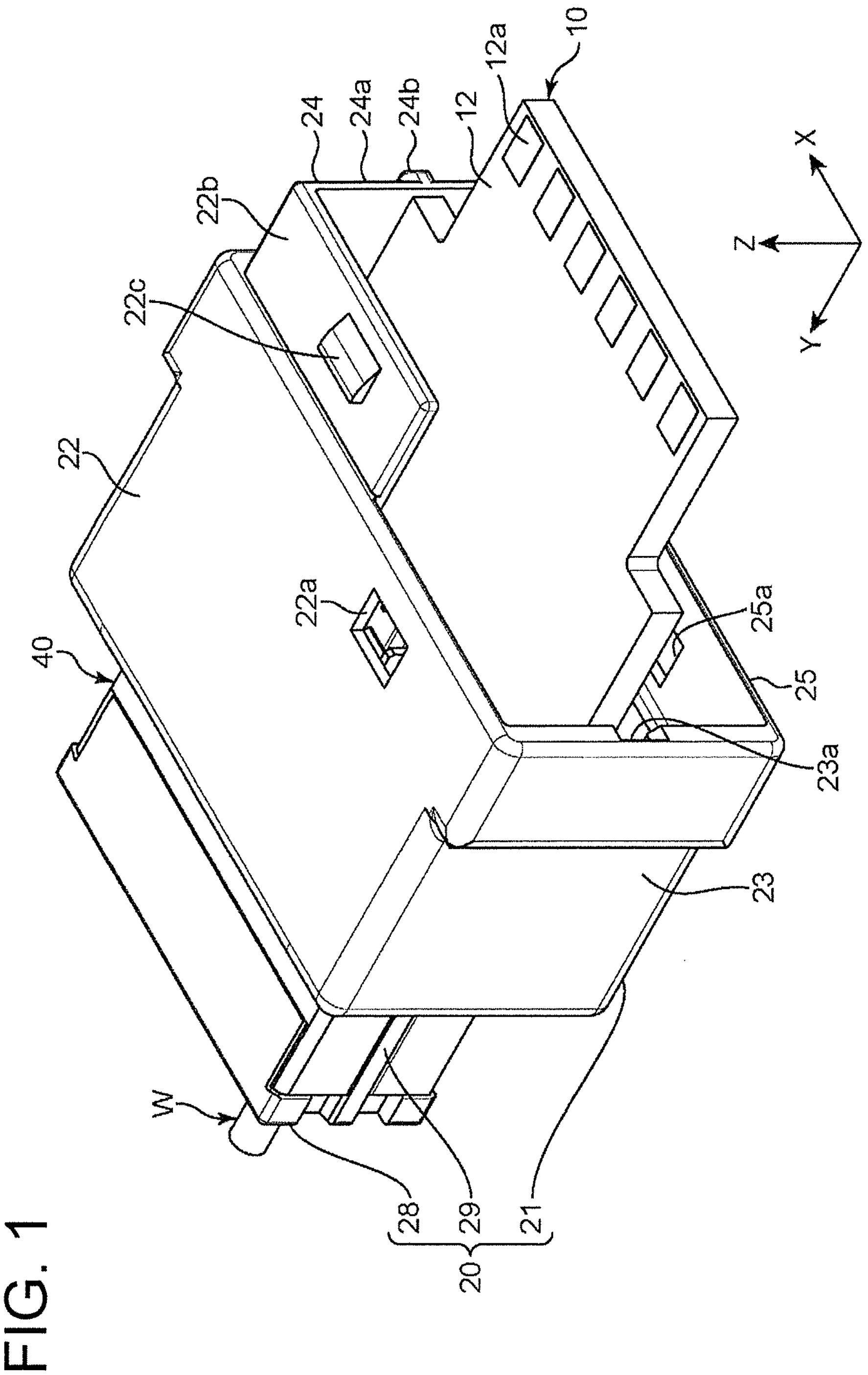
FIG. 1 is a perspective view of an electronic circuit unit of one embodiment of the present invention.
Figure 2:
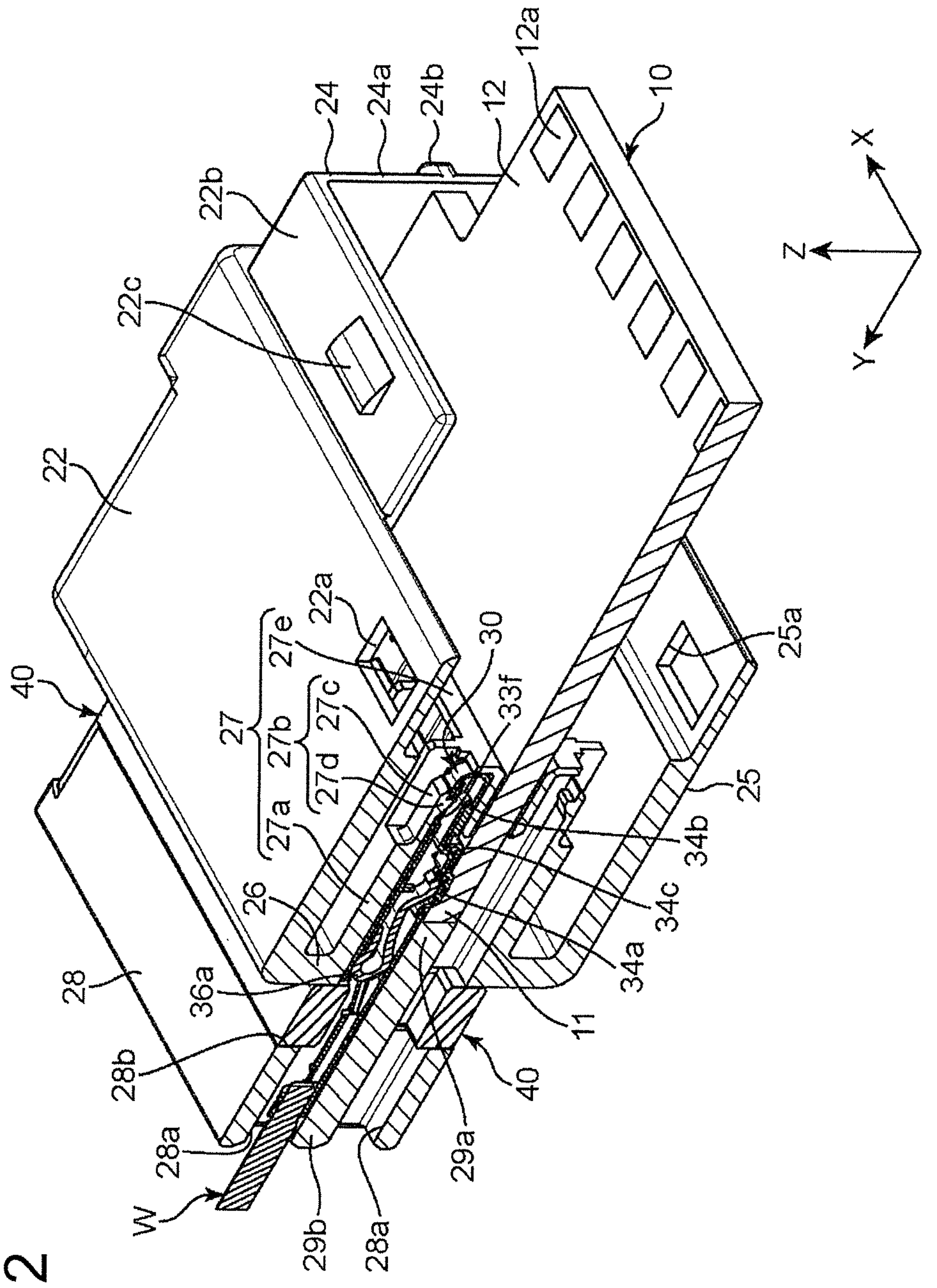
FIG. 2 is a perspective view in section of the electronic circuit unit of FIG. 1.
Figure 3:
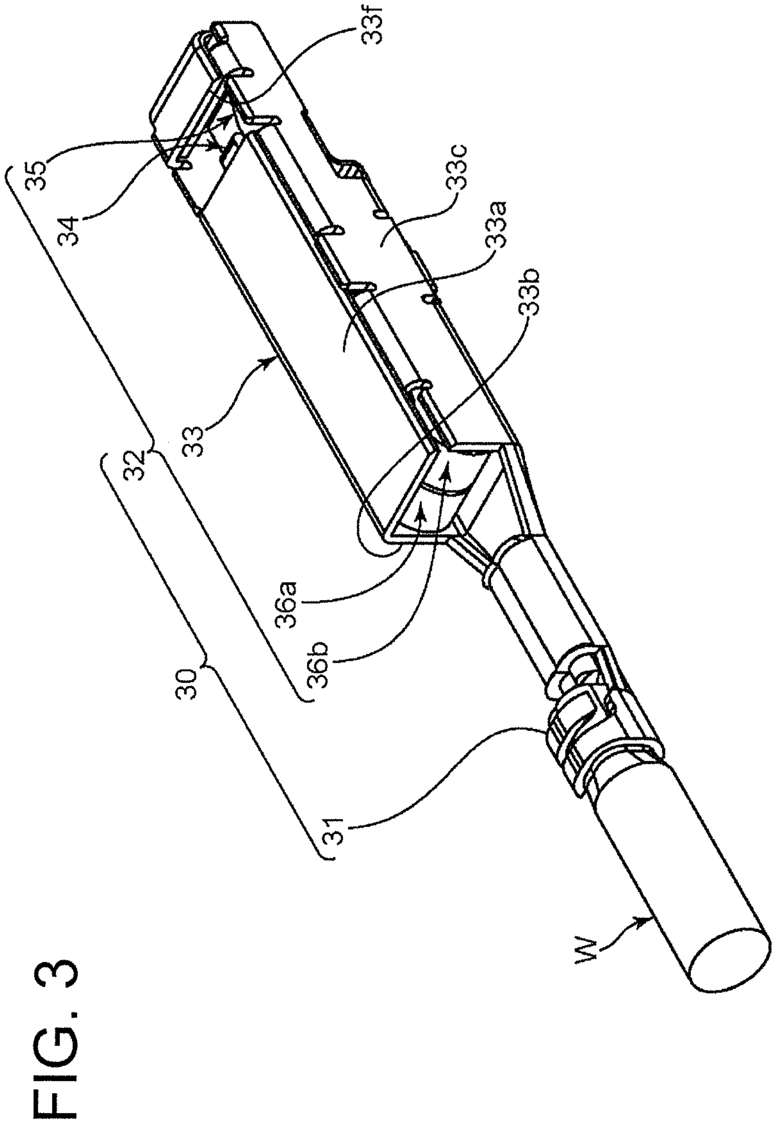
FIG. 3 is a perspective view of a terminal of the electronic circuit unit shown in FIG. 1.
Figure 4:
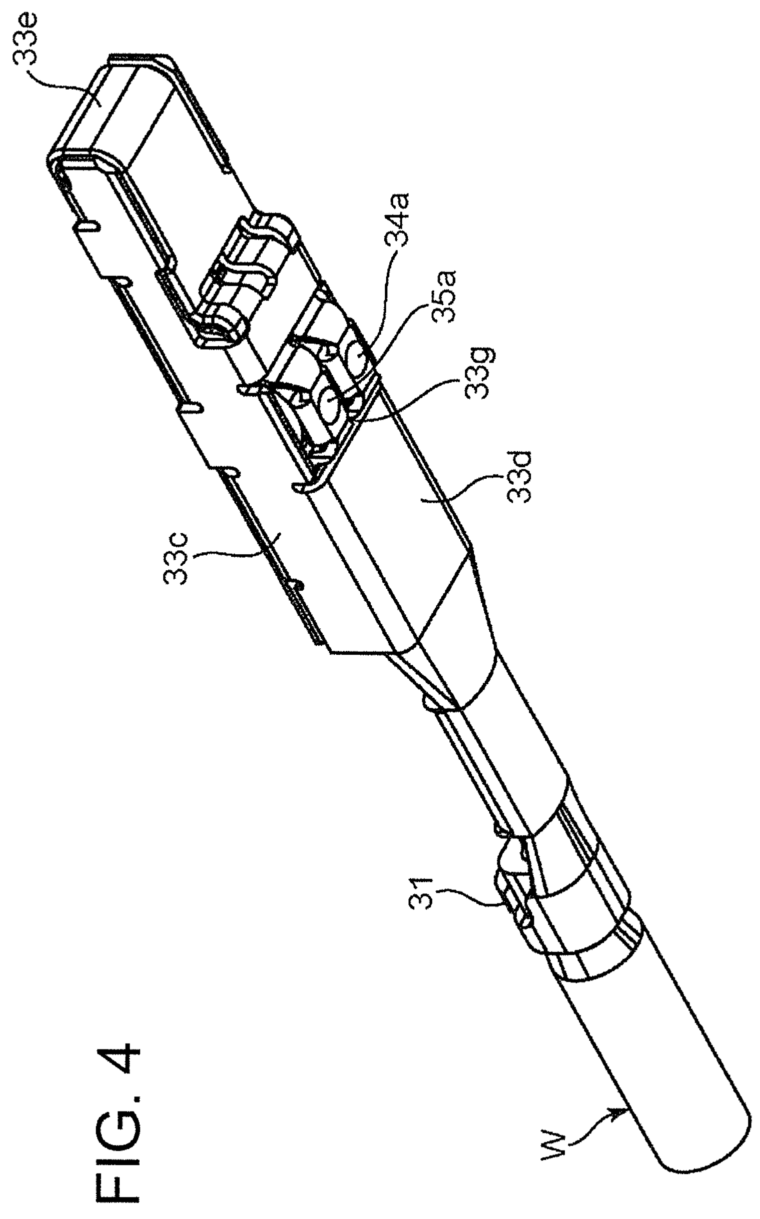
FIG. 4 is a perspective view showing a state where the terminal shown in FIG. 3 is viewed from a different angle.

An electronic circuit unit of one embodiment of the present invention is described with reference to FIGS. 1 to 7. In the following description, an arrangement direction of a plurality of connection conductors 12*a* to be described later is referred to as an X-axis direction or a lateral direction, a thickness direction of a circuit board 10 is referred to as a Z-axis direction or a vertical direction and a direction perpendicular to X and Z axes is referred to as a Y-axis direction or a front-back direction. Here, a state where only one wire W to be described later is inserted is shown in FIGS. 1 and 2. Although a state where a first contact portion 34*a* to be described later is retracted into the circuit board 10 is shown in FIG. 2, the first contact portion 34*a* is actually displaced upward by this retracting distance, thereby being held in contact with the circuit board 10 at a predetermined contact pressure.

The electronic circuit unit in this embodiment includes the circuit board 10, a housing 20 for housing this circuit board 10, terminals 30 to be connected to the circuit board 10 and retainers 40 to be mounted into the housing 20.

The circuit board 10 is, for example, a printed wiring board provided with wiring patterns (not shown) for circuit configuration on top and under surfaces thereof, and electronic components for configuring circuits are mounted on the top surface. This circuit board 10 includes a first edge portion 11 on one side in the Y-axis direction (rear side in FIG. 2) and a second edge portion 12 on the other side (front side in FIG. 2). The first edge portion 11 includes a plurality of connection conductors on top and under surface thereof, and the second edge portion 12 also includes a plurality of connection conductors on top and under surface thereof. A plurality of these connection conductors are juxtaposed in a width direction (X-axis direction) of the circuit board 10.

The housing 20 includes a board housing portion 21 for housing the circuit board 10, a wire housing portion 28 for housing the wires W and an intermediate wall 29 provided at an intermediate position in the Z-axis direction of the housing 20. The housing 20 is made of an insulating material such as synthetic resin. This housing 20 can completely house the circuit board 10 by being connected to another housing (not shown) having the same shape as the housing 20. Note that the housing 20 has only to include parts for holding the wires W and the terminals 30 and other parts can be omitted.

The board housing portion 21 is open in a specific direction (forward direction in FIGS. 1 and 2) and shaped to allow the circuit board 10 to be inserted in a direction (Y-axis direction of FIG. 2) perpendicular to a thickness direction of the circuit board 10 and housed therein. Specifically, the board housing portion 21 includes an upper wall 22, a first side wall 23, a second side wall 24 and a bottom wall 25 forming a space into which the circuit board 10 can be housed, a rear wall 26 provided on the sides of these walls 22 to 25 near the wire housing portion 28 (rear end side), and terminal holding walls 27 shaped to extend forward from the rear wall 26 and configured to hold the terminals 30. The upper wall 22 and the bottom wall 25 are arranged to vertically face each other in parallel with each other, and the first and second side walls 23, 24 are arranged to laterally face each other in parallel with each other. These upper wall 22, first side wall 23, second side wall 24 and bottom wall 25 form a rectangular tube body.

The upper wall 22 includes a locking portion 22*a* provided near the front end thereof, a guiding wall 22*b* for guiding the connection of the housing 20 to the other housing paired with the housing 20 and a locked portion 22*c* provided on the upper surface of the guiding wall 22*b*. The locking portion 22*a* is provided at a position displaced toward one side (left side in FIG. 1) in the X-axis direction near the front end of the upper wall 22. The guiding wall 22*b* is provided at a position displaced toward the other side (right side in FIG. 1) in the X-axis direction. The locked portion 22*c* is shaped to be engageable with the locking portion 22*a*. The first side wall 23 includes a groove 23*a* at an intermediate position on the inner surface thereof in the Z-axis direction. This groove 23*a* is shaped to extend in the Y-axis direction from the front end toward the rear end of the first side wall 23. The second side wall 24 includes a guiding wall 24*a* for guiding the connection of the housing 20 to the other housing paired with the housing 20 and a protrusion 24*b* provided at an intermediate position of the outer surface of the guiding wall 24*a* in the Z-axis direction. The protrusion 24*b* is shaped to extend in the Y-axis direction from the front end toward the rear end of the guiding wall 24*a*. Further, this protrusion 24*b* is shaped to be fittable into the groove 23*a*. The bottom wall 25 includes a locking portion 25*a* provided near the front end thereof. This locking portion 25*a* is shaped to be engageable with a locked portion (not shown) provided on the other housing paired with the housing 20. The rear wall 26 is shaped to close rear end sides of the upper wall 22, the first side wall 23, the second side wall 24 and the bottom wall 25 while leaving a space into which the terminals 30 inserted from the side of the wire housing portion 28 can be received.

Each terminal holding wall 27 includes a peripheral wall 27*a* extending forward from the rear wall 26, locking lances 27*b* extending forward from this peripheral wall 27*a* and a front wall 27*e* extending forward from the peripheral wall 27*a* and reaching a position before the locking lances 27*b*. The peripheral wall 27*a* is shaped to collectively surround the terminals 30 inserted from the side of the wire housing portion 28. The locking lance 27*b* is for locking each terminal 30. Specifically, the locking lance 27*b* includes a resilient locking piece 27*c* which is resiliently displaced in a direction to retract the front end thereof from the terminal 30 with the rear end thereof as a supporting point, and a locking projection 27*d* provided on the resilient locking piece 27*c*. This locking projection 27*d* locks the terminal 30 when the insertion of the terminal 30 is completed. The front wall 27*e* determines an insertion position of the terminal 30 by the contact with the front end of the terminal 30. The terminal holding walls 27 configure a pair of terminal holding portions for holding a plurality of terminals 30 together with a front portion 29*a* of the intermediate wall 29 to be described later. This pair of terminal holding portions are arranged in two upper and lower rows with the intermediate wall 29 therebetween. The pair of terminal holding portions hold the respective terminals 30 arranged side by side in the X-axis direction. Here, out of the pair of terminal holding portions, the terminal holding portion arranged in the upper row holds the terminals 30 such that the first contact portions 34*a* and the second contact portions 35*a* of the terminals 30 to be described later face downward, and the terminal holding portion arranged in the lower row holds the terminals 30 such that the first contact portions 34*a* and the second contact portions 35*a* of the terminals 30 face upward.

The wire housing portion 28 is integrally formed to the board housing portion 21 to be located behind and adjacent to the board housing portion 21. This wire housing portion 28 includes a plurality of wire housing chambers 28*a* and retainer mounting portions 28*b* into which the retainers 40 are to be mounted. The plurality of wire housing chambers 28*a* are arranged in two upper and lower rows with the intermediate wall 29 therebetween, and as many wire housing chambers 28*a* as the connection conductors are arranged side by side in the X-axis direction in each row. Each wire housing chamber 28*a* has a tubular shape having an inner peripheral surface shaped to surround the wire W and long in an axial direction (Y-axis direction) of the wire W. The retainer mounting portions 28*b* are arranged to be vertically paired and each of them is so shaped that the retainer 40 is mountable. Note that the connection conductors may not necessarily be arranged on the top and under surfaces of the circuit board 10 and may be provided only on one of these surfaces. In such a case, the terminal holding portion on the side where the connection conductors are not formed, out of the pair of terminal holding portions, and the retainer 40 on the same side are omitted.

The intermediate wall 29 is provided at a vertical intermediate position of the housing 20 and shaped to extend from the rear end of the wire housing portion 28 toward the board housing portion 21. The front portion 29*a* of this intermediate wall 29 holds the terminals 30 together with the terminal holding walls 27. Further, the front end surface of this intermediate wall 29 comes into contact with an end surface of the circuit board 10 on the side of the first edge portion 11, thereby determining an insertion position of the circuit board 10. A rear portion 29*b* of the intermediate wall 29 partitions the wire housing chambers 28*a* into two upper and lower rows.

As shown in FIGS. 3 to 7, the terminal 30 is mounted on an end of the wire W and includes a wire connecting portion 31 to be connected to the wire W and a board connecting portion 32 to be connected to the circuit board 10.

The wire W is composed of an unillustrated conductor and an insulation coating covering the conductor, and the insulation coating is partly removed at the end of the wire W to expose the conductor. The wire connecting portion 31 is so connected to the conductor as to embrace the conductor exposed at the end of the wire W, thereby being electrically conductively connected to the conductor.

The board connecting portion 32 includes a main portion 33 in the form of a rectangular tube, a first resilient contact piece 34 and a second resilient contact piece 35 provided in the main portion 33, and a first biasing member 36*a* and a second biasing member 36*b* provided in the main portion 33. This board connecting portion 32 is shaped to be long in a specific longitudinal direction (Y-axis direction in FIG. 2). The main portion 33 and the first and second resilient contact pieces 34, 35 are formed by bending one metal plate together with the wire connecting portion 31.

The main portion 33 includes an upper wall 33*a*, a first side wall 33*b*, a second side wall 33*c* and a bottom wall 33*d* forming a tubular part, and a front wall 33*e* for closing a front end side (right side of FIGS. 5 to 7) of this tubular part. Further, this main portion 33 includes a lance hole 33*f* provided at a position near the front end of the upper wall 33*a* and an opening 33*g* provided substantially in a central part of the bottom wall 33. The lance hole 33*f* is shaped to be engageable with the locking projection 27*d* of the locking lance 27*b*.

Figure 5:
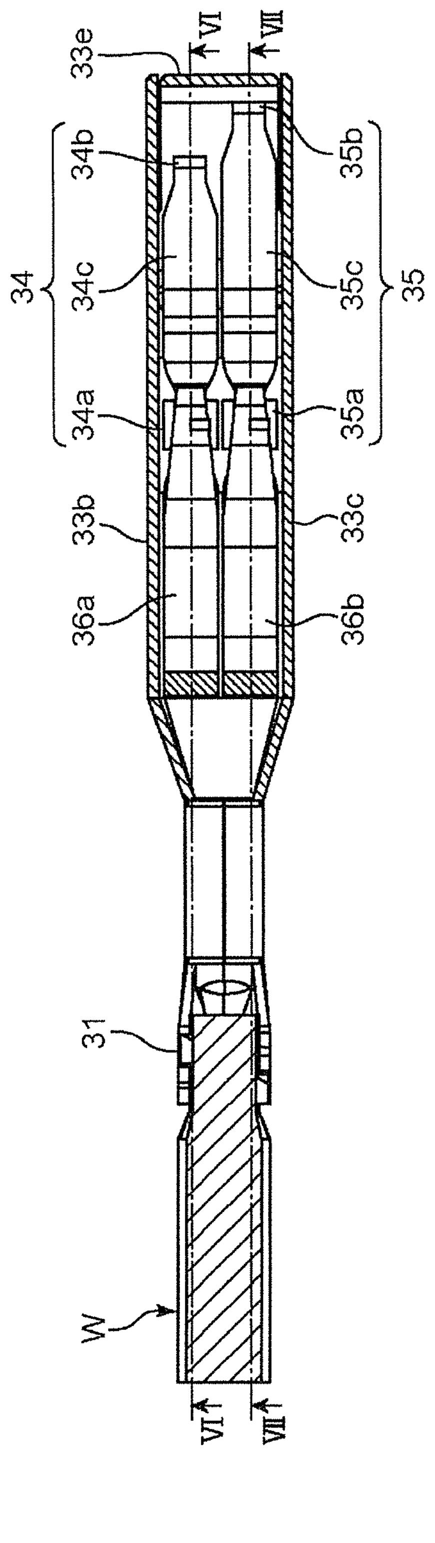
FIG. 5 is a plan view showing a state of the terminal shown in FIG. 3 with a part of the terminal omitted.
Figure 6:
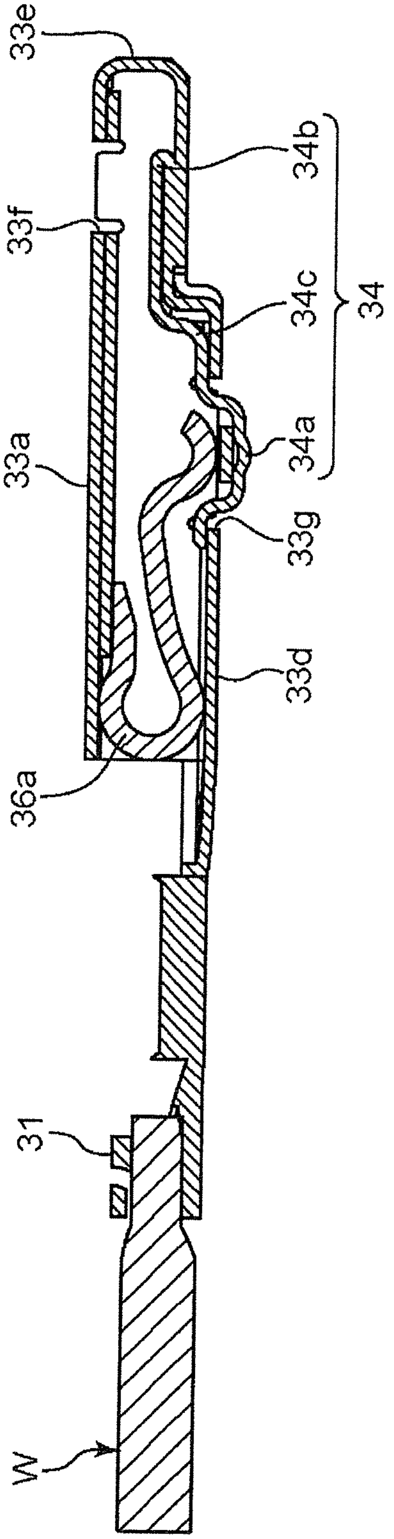
FIG. 6 is a section along VI-VI of the terminal shown in FIG. 5 without any omission.
Figure 7:
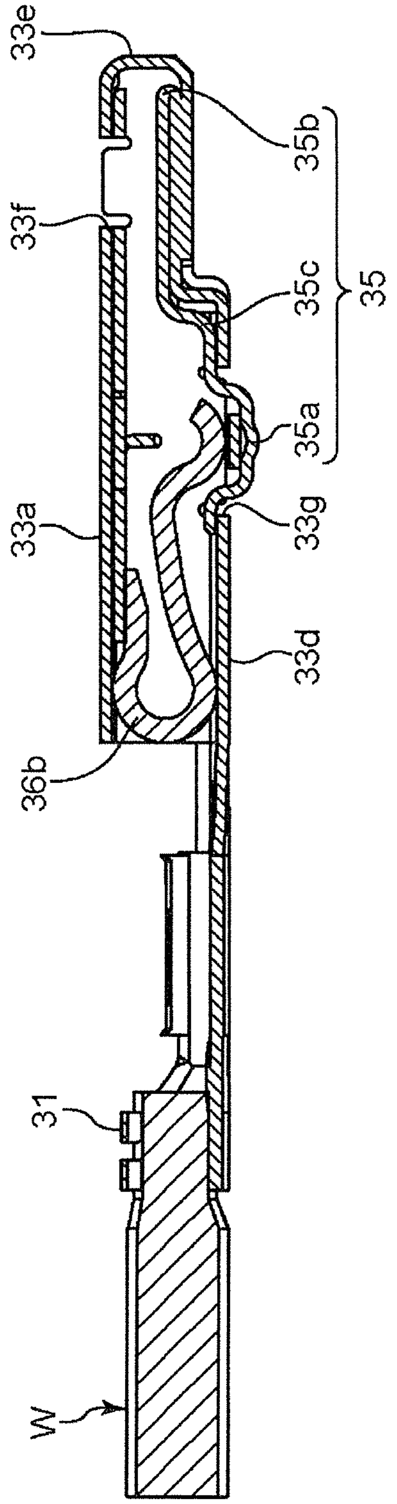
FIG. 7 is a section along VII-VII of the terminal shown in FIG. 5 without any omission.
Figure 8:
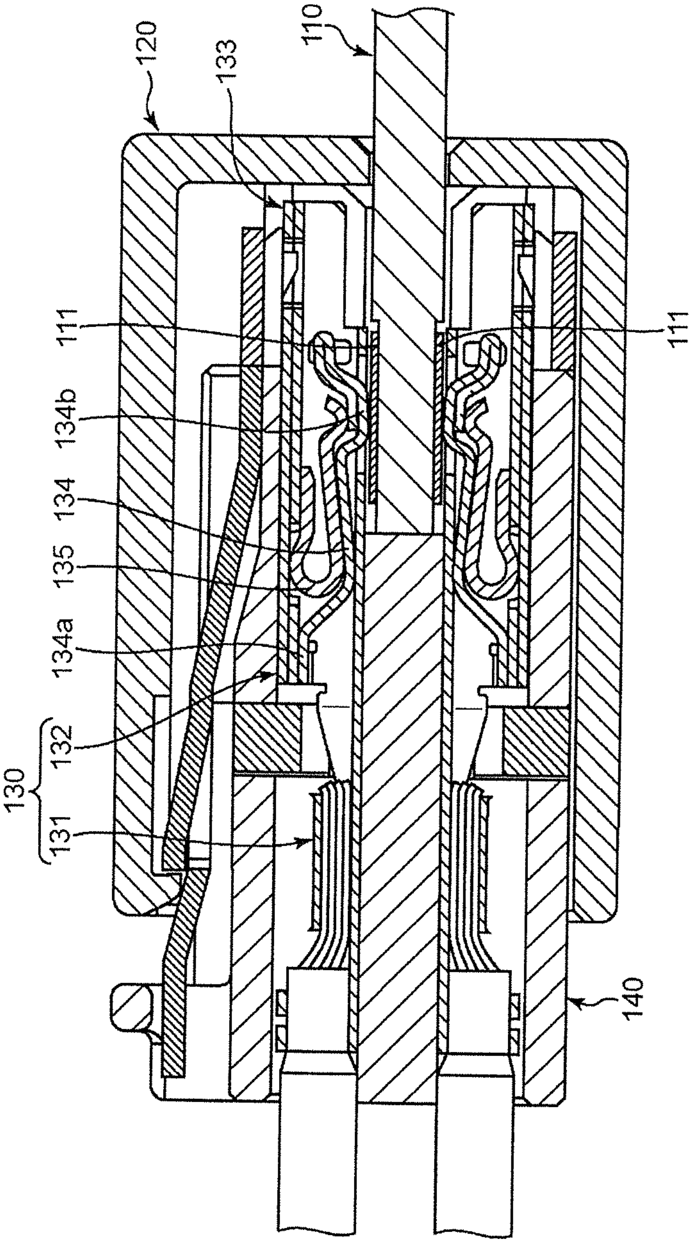
FIG. 8 is a perspective view showing an essential part of a conventional electronic circuit unit described in patent literature 1.
Figure 9:
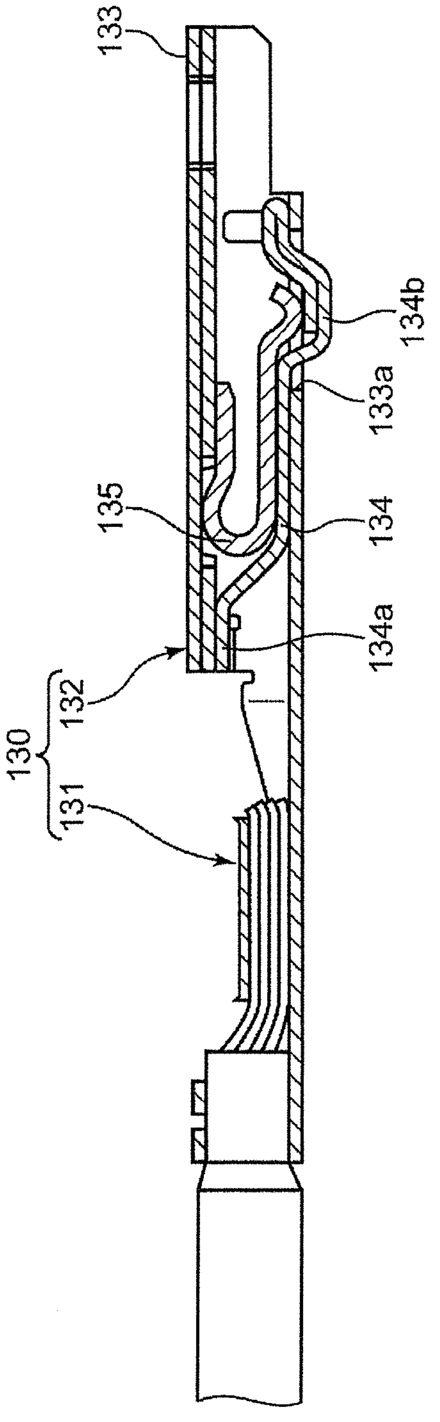
FIG. 9 is a section of a terminal of the conventional electronic circuit unit shown in FIG. 8.

The first resilient contact piece 34 is integrally provided to the main portion 33 and shaped to be long in the longitudinal direction (lateral direction of FIGS. 5 to 7). This first resilient contact piece 34 includes a first contact portion 34*a* to be brought into contact with the connection conductor provided on the first edge portion 11 of the circuit board 10, a first coupling portion 34*b* coupled to the main portion 33, and a first arm portion 34*c* connecting the first contact portion 34*a* and the first coupling portion 34*b*. The first contact portion 34*a* is provided on one end side (left side in FIGS. 5 to 7) of the first resilient contact piece 34 in the longitudinal direction, and shaped to protrude to the outside of the main portion 33 through the opening 33*g* of the main portion 33. The first coupling portion 34*b* is located on the other side (right side in FIGS. 5 to 7) of the first resilient contact piece 34 in the longitudinal direction and formed by bending a part of the metal plate forming the main portion 33. The first arm portion 34*c* is shaped to be long in the longitudinal direction (lateral direction of FIGS. 5 to 7) and has a constant thickness. This first resilient contact piece 34 can be resiliently deformed to allow the first contact portion 34*a* to be resiliently displaced in a thickness direction (vertical direction of FIG. 6) of the first resilient contact piece 34 with the first coupling portion 34*b* as a supporting point. Further, when the terminals 30 and the circuit board 10 are mounted into the housing 20 and the first contact portions 34*a* come into contact with the connection conductors, the first contact portions 34*a* are retracted into the main portions 33 by receiving a reaction force from the circuit board 10.

Similarly to the first resilient contact piece 34, the second resilient contact piece 35 is integrally provided to the main portion 33 and shaped to be long in the longitudinal direction (lateral direction of FIGS. 5 to 7). The second resilient contact piece 35 includes a second contact portion 35*a* to be brought into contact with the common connection conductor common to the connection conductor, with which the first contact portion 34*a* is brought into contact, a second coupling portion 35*b* coupled to the main portion 33, and a second arm portion 35*c* connecting the second contact portion 35*a* and the second coupling portion 35*b*. Here, the “common connection conductor” may be a single conductor shaped to be able to simultaneously come into contact with the first and second contact portions 34*a*, 35*a*, mutually independent conductors to be brought into contact with the first contact portion 34*a* and the second contact portion 35*a* and regarded as a single connection conductor by being connected by wiring, or the like. This second resilient contact piece 35 is shaped to have a natural vibration frequency different from that of the first resilient contact piece 34. Specifically, in this embodiment, a dimension of the second arm portion 35*c* of the second resilient contact piece 35 in the longitudinal direction is longer than that of the first arm portion 34*c*. Further, this second resilient contact piece 35 basically has the same shape as the first resilient contact piece 34 except that the dimension of the second arm portion 35*c* in the longitudinal direction is longer than that of the first arm portion 34*c*. Specifically, similarly to the first resilient contact piece 34, the second resilient contact piece 35 can also be resiliently deformed to allow the second contact portion 35*a* to be resiliently displaced in a thickness direction (vertical direction of FIG. 7) of the second resilient contact piece 35 with the second coupling portion 35*b* as a supporting point. Further, when the terminals 30 and the circuit board 10 are mounted into the housing 20 and the second contact portions 35*a* come into contact with the connection conductors, the second contact portions 35*a* are retracted into the main portions 33 by receiving a reaction force from the circuit board 10.

The first and second resilient contact pieces 34, 35 are arranged adjacent to each other in a direction (vertical direction of FIG. 5) perpendicular to both the longitudinal directions and the thickness directions in a state where the longitudinal directions thereof are parallel. More specifically, the first and second resilient contact pieces 34, 35 are arranged adjacent to each other in the arrangement direction in a state where the first and second contact portions 34*a*, 35*a* are arranged adjacent to each other in the arrangement direction and the first and second coupling portions 34*b*, 35*b* are separated from each other in the longitudinal direction (lateral direction of FIG. 5). Specifically, the second coupling portion 35*b* is located closer to the front wall 33*e* than the first coupling portion 34*b*.

The first biasing member 36*a* is mounted in a compressed state in the main portion 33, and biases the first contact portion 34*a* from the inside to the outside of the main portion 33 by a resilient restoring force thereof. This first biasing member 36*a* is shaped to be long in the longitudinal direction (lateral direction of FIG. 5) and arranged side by side with the first resilient contact piece 34 so that the longitudinal direction thereof and that of the first resilient contact piece 35 coincide. Similarly to the first biasing member 36*a*, the second biasing member 36*b* is mounted in a compressed state in the main portion 33, and biases the second contact portion 35*a* from the inside to the outside of the main portion 33 by a resilient restoring force thereof. This second biasing member 36*b* has the same shape as the first biasing member 36*a* and is arranged side by side with the second resilient contact piece 35 so that the longitudinal direction thereof and that of the second resilient contact piece 35 coincide.

The retainers 40 are mounted into the retainer mounting portions 28*b* of the wire housing portion 28 after the wires W and the terminals 30 are mounted into the housing 20. Each retainer 40 is shaped to be long in the X-axis direction, and the front end surface thereof comes into contact with the rear end surfaces of the main portions 33 of the terminals 30, thereby retaining the terminals 30.

Next, how to assemble this electronic circuit unit is described.

1) Insertion of each wire W and each terminal 30

Each wire W and each terminal 30 are inserted into the housing 20. Specifically, the board connecting portion 32 of the terminal 30 is inserted forward into the wire housing portion 28 and the front wall 33*e* of the terminal 30 is brought into contact with the front wall 27*e* of the board housing portion 21. At this time, the resilient locking piece 27*c* of the locking lance 27*b* is resiliently deformed to allow the locking projection 27*d* to be retracted from the terminal 30, and is resiliently restored when the insertion of the terminal 30 is completed (when the front wall 33*e* of the terminal 30 comes into contact with the front wall 27*e* of the board housing portion 21). In this way, the locking projection 27*d* is engaged with the lance hole 33*f* of the terminal 30.

2) Mounting of retainers 40

The retainer 40 is mounted into each retainer mounting portion 28*b* of the wire housing portion 28. In this way, the terminals 30 are retained in the housing 20.

3) Insertion of circuit board 10

In parallel with or before or after the processes 1) and 2), the circuit board 10 is inserted into the housing 20. Specifically, the circuit board 10 is inserted from a front side toward a rear side of the board housing portion 21 with the first edge portion 11 of the circuit board 10 in the lead and the end surface of the first edge portion 11 is brought into contact with the end surface of the intermediate wall 29 on the side of the front portion 29*a*. At this time, the connection conductors provided on the top and under surfaces of the first edge portion 11 and the first and second contact portions 34*a*, 35*a* of the terminals 30 come into contact. Simultaneously with this, the first and second resilient contact pieces 34, 35 are respectively so resiliently deformed that the first and second contact portions 34*a*, 35*a* are retracted into the main portions 33 of the terminals 30. In this state, a half of the circuit board 10 is housed in the housing 20.

4) Connection of housings

After the processes 1) to 3), the other housing (not shown) paired with the housing 20 and wires and terminals (not shown) mounted therein are connected to the housing 20. This causes the circuit board 10 to be entirely housed in the both housings.

Even if the electronic circuit unit assembled in this way is mounted in the vehicle and a vibromotive force is applied to the terminal 30 during vehicle running or the like, a contact failure due to the vibration of the terminal 30 is avoided. Specifically, the terminal 30 in this embodiment includes the first and second resilient contact pieces 34, 35 unlike conventional terminals and these resilient contact pieces are resiliently deformable independently of each other and shaped to have different natural vibration frequencies. Thus, even if either one of the resilient contact pieces resonates, the other resilient contact piece does not resonate and the contact portion thereof is kept stably in contact with the connection conductor. That is, since each terminal includes a single resilient contact piece in conventional electronic circuit units, the contact reliability of the contact portion and a connection conductor may be reduced if this resilient contact piece resonates. Contrary to this, in the electronic circuit unit of this embodiment, a reduction in the contact reliability of the terminal 30 and the connection conductor is suppressed.

Further, since the first and second resilient contact pieces 34, 35 of this embodiment are arranged adjacent to each other in the arrangement direction (vertical direction of FIG. 5), the dimension of the board connecting portion 32 including these resilient contact pieces in the longitudinal direction is shortened. Further, since the first and second contact portions 34*a*, 35*a* are arranged adjacent to each other in the arrangement direction, the both contact portions are easily brought into contact with the connection conductor.

Note that the embodiment disclosed this time should be considered to be illustrative in all aspects and not restrictive. The scope of the present invention is indicated not by the description of the above embodiment, but by the scope of claims and includes all changes within the scope of claims and within the meaning and scope of equivalents.

For example, in the above embodiment, the longitudinal dimension of the second arm portion 35*c* is set longer than that of the first arm portion 34*c* to make the natural vibration frequency of the second resilient contact piece 35 different from that of the first resilient contact piece 34. However, the natural vibration frequencies of the both may be made different by making the thickness of the second resilient contact piece 35 and that of the first resilient contact piece 34 different.

Further, the connector into which the terminal of the present invention is to be mounted is not limited to the card edge connector.

The embodiment described above mainly includes inventions having the following configurations.

A terminal used in an electronic circuit unit with a circuit board including an edge portion and a plurality of connection conductors on a surface of the edge portion, a housing for housing the circuit board and a plurality of terminals respectively provided on ends of a plurality of wires to be connected to the respective connection conductors of the circuit board and each including a contact portion to be brought into contact with the corresponding connection conductor includes a wire connecting portion to be connected to an end portion of the wire and a board connecting portion to be connected to the connection conductor. The board connecting portion includes a first resilient contact piece having a first contact portion to be resiliently brought into contact with the connection conductor and resiliently deformable so as to allow a resilient displacement of the first contact portion and a second resilient contact piece having a second contact portion to be resiliently brought into contact with the connection conductor common to the connection conductor, with which the first contact portion is brought into contact, and resiliently deformable so as to allow a resilient displacement of the second contact portion. The first and second resilient contact pieces are resiliently deformable independently of each other and shaped to have mutually different natural vibration frequencies. Here, the "connection conductor common to the connection conductor, with which the first contact portion is brought into contact" may be a single conductor shaped to be able to simultaneously come into contact with the first and second contact portions, mutually independent conductors to come into contact with the first contact portion and the second contact portion and regarded as a single connection conductor by being connected by wiring or the like.

Since the board connecting portion of the terminal of this invention includes the first and second resilient contact pieces resiliently deformable independently of each other and shaped to have mutually different natural vibration frequencies, even if either one of the resilient contact pieces resonates, the other resilient contact piece does not resonate and the contact portion thereof is kept stably in contact with the connection conductor. This can suppress a reduction in the contact reliability of the terminal and the connection conductor.

In this case, the first and second resilient contact pieces are shaped to extend in specific longitudinal directions perpendicular to resilient displacement directions and have mutually different lengths in the longitudinal directions.

In this invention, the natural vibration frequencies of the both resilient contact pieces are easily made different from each other.

Further, in this case, the first contact portion is formed on one end of the first resilient contact piece in the longitudinal direction, the first resilient contact piece is resiliently deformable so that the first contact portion is resiliently displaced with the other end of the first resilient contact piece in the longitudinal direction as a supporting point, the second contact portion is formed on one end of the second resilient contact piece in the longitudinal direction, the second resilient contact piece is resiliently deformable so that the second contact portion is resiliently displaced with the other end of the second resilient contact piece in the longitudinal direction as a supporting point, and the first and second resilient contact pieces are so arranged adjacent to each other in an arrangement direction perpendicular to the longitudinal directions and thickness directions thereof that the longitudinal directions thereof are parallel.

According to this invention, since the first and second resilient contact pieces are arranged adjacent to each other in the arrangement direction, the board connecting portion including these resilient contact pieces is made smaller in size. Specifically, dimensions of the first and second resilient contact pieces in the thickness directions and the arrangement direction in the board connecting portion are shortened.

Further, the other end of the first resilient contact piece and that of the second resilient contact piece are so arranged to be longitudinally separated from each other that the first and second contact portions are adjacent to each other in the arrangement direction.

According to this invention, the both contact portions are easily brought into contact with the connection conductor and the connection conductor can be made smaller in size.

LIST OF REFERENCE SIGNS

10 circuit board
11 first edge portion
12 second edge portion
12*a* connection conductor
20 housing
21 board housing portion
22 upper wall
22*a* locking portion
22*b* guiding wall
22*c* locked portion
23 first side wall
23*a* groove
24 second side wall
24*a* guiding wall
24*b* protrusion
25 bottom wall
25*a* locking portion
26 rear wall
26 terminal holding wall
27*a* terminal guiding portion
27*b* locking lance
27*c* resilient locking piece
27*d* locking projection
27*e* front wall
28 wire housing portion
28*a* wire housing chamber
28*b* retainer mounting portion
29 intermediate wall
29*a* front portion
29*b* rear portion
30 terminal
31 wire connecting portion
32 board connecting portion
33 main portion
33*a* upper wall
33*b* first side wall
33*c* second side wall
33*d* bottom wall
33*e* front wall
33*f* lance hole
33*g* opening
34 first resilient contact piece
34*a* first contact portion
34*b* first coupling portion
34*c* first arm portion
35 second resilient contact piece
35*a* second contact portion
35*b* second coupling portion
35*c* second arm portion
36*a* first biasing member
36*b* second biasing member
40 retainer

The invention claimed is:

1. A terminal used in an electronic circuit unit with a circuit board including an edge portion and a plurality of connection conductors on a surface of the edge portion, a housing for housing the circuit board and a plurality of terminals respectively provided on ends of a plurality of wires to be connected to the respective connection conductors of the circuit board and each including a contact portion to be brought into contact with the corresponding connection conductor, comprising:

a wire connecting portion to be connected to an end portion of the wire; and a board connecting portion to be connected to the connection conductor;

wherein the board connecting portion includes a substantially rectangular tubular main portion having opposite front and rear ends, a bottom wall formed with an opening and opposite first and second side walls extending from the bottom wall, a first resilient contact piece bent from the bottom wall at a first distance from the front end and extending into the tubular main body, the first resilient contact piece being adjacent the first side wall and having a first contact portion projecting into the opening to be brought resiliently into contact with the connection conductor and being resiliently deformable so as to allow a resilient displacement of the first contact portion and a second resilient contact piece bent from the bottom wall at a second distance from the front end and extending into the tubular main body, the second resilient contact piece being adjacent the second side wall and having a second contact portion projecting into the opening to be brought resiliently into contact with the connection conductor that is contacted by the first contact portion and being resiliently deformable so as to allow a resilient displacement of the second contact portion, and the first and second distances being different from one another so that the first and second resilient contact pieces are resiliently deformable independently of each other and have mutually different natural vibration frequencies.

2. The terminal of claim 1, wherein the first and second resilient contact pieces are shaped to extend in specific longitudinal directions perpendicular to resilient displacement directions and have mutually different lengths in the longitudinal directions.

3. The terminal of claim 2, wherein:

the first resilient contact piece has opposite first and second ends in the longitudinal direction, the first contact portion being formed on the first end of the first resilient contact piece and the first resilient contact piece being resiliently deformable so that the first contact portion is displaced resiliently with the second end of the first resilient contact piece as a support;

the second resilient contact piece has opposite first and second ends in the longitudinal direction, the second contact portion being formed on the first end of the second resilient contact piece and the second resilient contact piece being resiliently deformable so that the second contact portion is displaced resiliently with the second end of the second resilient contact piece as a support; and the first and second resilient contact pieces are arranged adjacent to each other in an arrangement direction perpendicular to the longitudinal directions and thickness directions thereof so that the longitudinal directions thereof are parallel.

4. The terminal of claim 3, wherein the second end of the first resilient contact piece and the second end of the second resilient contact piece are arranged to be longitudinally separated from each other so that the first and second contact portions are adjacent to each other in the arrangement direction.

5. A terminal, comprising:

a wire connecting portion to be connected to an end portion of a wire; and a board connecting portion extending from the wire connecting portion, the board connecting portion including:

a substantially rectangular tubular main portion having opposite front and rear ends, a bottom wall and opposite first and second side walls extending from the bottom wall, a first resilient contact piece bent from the bottom wall at a first distance from the front end and extending into the tubular main body at a position adjacent the first side wall, the first resilient contact piece having a first contact at a specified distance from the rear end and being configured for contacting a mating contact, and a second resilient contact piece bent from the bottom wall at a second distance from the front end and extending into the tubular main body at a position adjacent the second side wall, the second resilient contact piece having a second contact portion at the specified distance from the rear end and being configured for contacting the mating contact, wherein the first and second distances are different from one another so that the first and second resilient contact pieces have mutually different natural vibration frequencies.

6. The terminal of claim 5, further comprising at least one biasing member disposed in the tubular main body and being compressed for urging at least one of the first and second contact portions against the mating contact.

7. The terminal of claim 6 wherein the at least one biasing member comprises a first biasing member disposed for urging the first contact portion against the mating contact and a second biasing member disposed for urging the second contact portion against the mating contact.

* * * * *